United States Patent
Qiu et al.

(10) Patent No.: US 12,501,576 B2
(45) Date of Patent: Dec. 16, 2025

(54) HEAD-MOUNTED DEVICE AND HEAT DISSIPATION METHOD THEREFOR, AND COMPUTER-READABLE STORAGE MEDIUM

(71) Applicant: GOERTEK INC., Shandong (CN)

(72) Inventors: Tao Qiu, Shandong (CN); Xiangjun Zhang, Shandong (CN); Tiecun Wang, Shandong (CN); Wenjie Liu, Shandong (CN)

(73) Assignee: GOERTEK INC., Weifang (CN)

( * ) Notice: Subject to any disclaimer, the term of this patent is extended or adjusted under 35 U.S.C. 154(b) by 374 days.

(21) Appl. No.: 18/003,926

(22) PCT Filed: Oct. 24, 2020

(86) PCT No.: PCT/CN2020/123469
§ 371 (c)(1),
(2) Date: Dec. 30, 2022

(87) PCT Pub. No.: WO2022/000880
PCT Pub. Date: Jan. 6, 2022

(65) Prior Publication Data
US 2023/0269903 A1    Aug. 24, 2023

(30) Foreign Application Priority Data

Jun. 30, 2020  (CN) .......................... 202010619090.8

(51) Int. Cl.
*H05K 7/20*  (2006.01)
*G01K 1/024*  (2021.01)
(Continued)

(52) U.S. Cl.
CPC ......... *H05K 7/20154* (2013.01); *G01K 1/024* (2013.01); *G01P 1/026* (2013.01); *G02B 27/017* (2013.01); *H05K 7/20209* (2013.01)

(58) Field of Classification Search
CPC ................................................. H05K 7/20209
See application file for complete search history.

(56) References Cited

U.S. PATENT DOCUMENTS 10,261,555 B1    4/2019  Cooper et al.
2013/0229765 A1*  9/2013  Weng ..................... G06F 1/206
                                          361/679.33

(Continued)

FOREIGN PATENT DOCUMENTS

CN    105934134 A    9/2016
CN    207833441 U    9/2018
(Continued)

OTHER PUBLICATIONS

International Search Report from International Application No. PCT/CN2020/123469 mailed Mar. 29, 2021.

*Primary Examiner* — Lisa M Caputo
*Assistant Examiner* — Cynthia L Davis
(74) *Attorney, Agent, or Firm* — Shih IP Law Group, PLLC (57) ABSTRACT

Disclosed is a heat dissipation method for a head-mounted device. A temperature sensor, a heat dissipation fan and a power supply are disposed in the head-mounted device. The heat dissipation method for a head-mounted device comprises: obtaining a temperature acquired by the temperature sensor and an electric quantity of the power supply periodically or in real time; and activating the heat dissipation fan when it is determined that the head-mounted device satisfies a heat dissipation condition according to the temperature and the electric quantity. Further disclosed are a head-mounted device and a computer-readable storage medium. By means of the present disclosure, heat dissipation can be performed on a head-mounted device in a timely manner, thereby ensuring the service life of the head-mounted device.

14 Claims, 5 Drawing Sheets

(51) Int. Cl.
*G01P 1/02* (2006.01)
*G02B 27/01* (2006.01)

(56) References Cited

U.S. PATENT DOCUMENTS

2014/0333773 A1 11/2014 Davis et al.
2015/0176589 A1* 6/2015 Tsai .................... F04D 27/004
                                                                               417/42
2016/0004085 A1 1/2016 Stroetmann

FOREIGN PATENT DOCUMENTS

| CN | 109496116 A | 3/2019 |
| CN | 109799889 A | 5/2019 |
| CN | 110398839 A | 11/2019 |
| CN | 111770666 A | 10/2020 |

* cited by examiner

Fig. 1 obtaining a temperature acquired by the temperature sensor and an electric quantity of the power supply periodically or in real time — S10 when it is determined that the head-mounted device satisfies a heat dissipation condition according to the temperature and the electric quantity, activating the heat dissipation fan — S20

HEAD-MOUNTED DEVICE AND HEAT DISSIPATION METHOD THEREFOR, AND COMPUTER-READABLE STORAGE MEDIUM

The present disclosure claims the priority of Chinese Patent Application No. 202010619090.8, titled "HEAD-MOUNTED DEVICE AND HEAT DISSIPATION METHOD THEREFOR, AND COMPUTER-READABLE STORAGE MEDIUM", filed on Jun. 30, 2020, which is incorporated by reference as if fully set forth herein.

TECHNICAL FIELD

The present disclosure relates to the field of virtual technology, and in particular, to a head-mounted device and a heat dissipation method thereof, and a computer-readable storage medium.

BACKGROUND ART

With the development of computer technology, more and more people begin to use head-mounted devices such as VR (Virtual Reality), AR (Augmented Reality) and the like. Through the head-mounted devices, people not only enjoy the fun of virtual world, but also conceive and create in the virtual world.

The head-mounted devices require users to wear them on their heads. However, due to high integration of the head-mounted device, the head-mounted device generates a large amount of heat. In exemplary technologies, the heat dissipation capacity of the head-mounted device is poor, which results in a high internal temperature of the head-mounted device and shortens the service life of the head-mounted device.

SUMMARY

A main object of the present disclosure is to provide a head-mounted device and a heat dissipation method thereof, and a computer-readable storage medium, aiming to solve the problem that the service life of the head-mounted device is short.

To achieve the above object, the present disclosure provides a heat dissipation method for a head-mounted device, the head-mounted device is provided with a temperature sensor, a heat dissipation fan and a power supply therein, and the heat dissipation method for a head-mounted device includes:
  obtaining a temperature acquired by the temperature sensor and an electric quantity of the power supply periodically or in real time; and
  activating the heat dissipation fan when it is determined that the head-mounted device satisfies a heat dissipation condition according to the temperature and the electric quantity.

In an embodiment, the method further includes: after the step of activating the heat dissipation fan,
  determining a first temperature change rate of the head-mounted device periodically according to the temperature acquired by the temperature sensor;
  determining a target rotational speed of the heat dissipation fan according to the first temperature change rate; and
  adjusting a rotational speed of the heat dissipation fan according to the target rotational speed.

In an embodiment, the step of determining a target rotational speed of the heat dissipation fan according to the first temperature change rate includes:
  when a current first temperature change rate is less than a first temperature change rate determined last time, updating cumulative number of times that the current first temperature change rate is continuously less than the first temperature change rate determined last time;
  when the cumulative number of times reach a preset number of times, clearing the cumulative number of times, and determining the target rotational speed of the heat dissipation fan according to a preset proportional value and a current rotational speed of the heat dissipation fan, wherein the preset proportional value of the heat dissipation fan is less than 1.

In an embodiment, the step of determining a target rotational speed of the heat dissipation fan according to the first temperature change rate includes:
  determining the target rotational speed of the heat dissipation fan according to the first temperature change rate and a current electric quantity of the power supply.

In an embodiment, the step of determining the target rotational speed of the heat dissipation fan according to the first temperature change rate and a current electric quantity of the power supply includes:
  performing a weighted calculation to the first temperature change rate and the current electric quantity of the power supply to determine a first reference parameter according to a weight corresponding to the first temperature change rate and a weight corresponding to the current electric quantity of the power supply; and
  determining the target rotational speed of the heat dissipation fan according to a mapping relationship between the reference parameter and the rotational speed of the heat dissipation fan, and the first reference parameter.

In an embodiment, the first reference parameter is determined by a weighting formula, the weighting formula is $R=0.7*K+0.3*C$; wherein, R is the first reference parameter, K is the temperature, 0.7 is weight corresponding to the temperature, C is the electric quantity, and 0.3 is the weight corresponding to the electric quantity.

In an embodiment, the method further includes: after the step of determining a first temperature change rate of the head-mounted device periodically according to the temperature acquired by the temperature sensor,
  determining whether the first temperature change rate is less than or equal to a preset change rate;
  when it is determined that the first temperature change rate is less than or equal to the preset change rate, controlling the heat dissipation fan to stop operating; and
  when it is determined that the first temperature change rate is greater than the preset change rate, performing the step of determining a target rotational speed of the heat dissipation fan according to the first temperature change rate.

In an embodiment, when a second reference parameter is greater than or equal to a first preset threshold value, it is determined that the head-mounted device satisfies the heat dissipation condition, wherein the second reference parameter is determined according to a second temperature change rate of the head-mounted device and the electric quantity, and the second temperature change rate is determined by the temperature acquired by the temperature sensor.

In an embodiment, when a second reference parameter is greater than or equal to a first preset threshold value and second temperature change rates within a preset time period increase sequentially, it is determined that the head-mounted device satisfies the heat dissipation condition, wherein the second reference parameter is determined according to the second temperature change rate of the head-mounted device and the electric quantity, and the second temperature change rate is determined by the temperature acquired by the temperature sensor.

In an embodiment, each module on a mainboard of the head-mounted device is provided with a corresponding temperature sensor, and the method further includes: before the step of activating the heat dissipation fan when it is determined that the head-mounted device satisfies the heat dissipation condition according to the temperature and the electric quantity,     determining whether the head-mounted device satisfies the heat dissipation condition according to the temperature and the electric quantity;

wherein the step of determining whether the head-mounted device satisfies the heat dissipation condition according to the temperature and the electric quantity includes:

determining a third temperature change rate corresponding to each module according to a temperature acquired by the temperature sensor corresponding to the module;

determining a third reference parameter corresponding to each module according to the third temperature change rate and the electric quantity; and     determining whether the third reference parameter satisfies a preset condition, wherein when third reference parameters satisfy the preset condition, it is determined that the head-mounted device satisfies the heat dissipation condition.

In an embodiment, the preset condition includes:

any one of the third reference parameters is greater than or equal to a second preset threshold value; or a weighted parameter obtained by performing a weighted calculation to the third reference parameters is greater than or equal to a third preset threshold value.

In an embodiment, the head-mounted device includes a plurality of heat dissipation fans, the heat dissipation fans are disposed corresponding to one or more modules, and the step of activating the heat dissipation fan includes:

determining a target heat dissipation fan among the heat dissipation fans, wherein the third reference parameter of at least one module corresponding to the target heat dissipation fan is greater than or equal to a second preset threshold value, or, a weighted parameter corresponding to the target heat dissipation fan obtained by performing a weighted calculation to the third reference parameter of modules corresponding to the target heat dissipation fan is greater than or equal to a third preset threshold value; and     activating the target heat dissipation fan.

In order to achieve the above object, the present disclosure also provides a head-mounted device, the head-mounted device includes a temperature sensor, a heat dissipation fan, a power supply, a memory, a processor, and a heat dissipation control program stored in the memory and operable on the processor, wherein the heat dissipation fan, the power supply and the temperature sensor are connected with the processor, and when the heat dissipation control program is executed by the processor, the steps of the heat dissipation method for a head-mounted device as described above are implemented.

In an embodiment, each module on a mainboard of the head-mounted device is provided with a corresponding temperature sensor, and the head-mounted device is provided with a plurality of heat dissipation fans, each of which is provided corresponding to one or more modules.

In order to achieve the above object, the present disclosure also provides a computer-readable storage medium, wherein a heat dissipation control program is stored in the computer-readable storage medium, and when the heat dissipation control program is executed by a processor, the steps of the heat dissipation method for a head-mounted device as described above are implemented.

According to the head-mounted device, the heat dissipation method thereof, and the computer-readable storage medium provided in the present disclosure, the head-mounted device is provided with a temperature sensor, a heat dissipation fan and a power supply therein, and the head-mounted device acquires the temperature acquired by the temperature sensor and the electric quantity of the power supply in real time or periodically, and when it is determined that the head-mounted device satisfies the heat dissipation condition according to the temperature and the electric quantity, activates the heat dissipation fan to dissipate heat of the head-mounted device. When it is determined that heat dissipation is required for the head-mounted device, the heat dissipation fan is activated to dissipate heat of the head-mounted device, which improves the heat dissipation capability of the head-mounted device, avoids damage to the head-mounted device due to heat accumulation in the head-mounted device, and ensures the service life of the head-mounted device.

BRIEF DESCRIPTION OF THE DRAWINGS

In order to more clearly illustrate the embodiments of the present disclosure or the technical solutions in the prior art, the following will briefly introduce the accompanying drawings required for the description of the embodiments or the prior art. Obviously, the drawings in the following description are only part of the drawings of the present disclosure, and for those skilled in the art, other drawings can also be obtained according to the provided drawings without any creative effort.

DETAILED DESCRIPTION OF THE EMBODIMENTS

The technical solutions in the embodiments of the present disclosure will be described below with reference to the drawings in the embodiments of the present disclosure. Obviously, the described embodiments are only part of the embodiments of the present disclosure, rather than all the embodiments. Based on the embodiments in the present disclosure, all other embodiments obtained by persons of ordinary skill in the art without creative efforts shall fall within the protection scope of the present disclosure.

A main technical solution of the embodiment of the present disclosure is to acquire a temperature acquired by the temperature sensor and an electric quantity of the power supply periodically or in real time; and activate the heat dissipation fan when it is determined that the head-mounted device satisfies a heat dissipation condition according to the temperature and the electric quantity.

When it is determined that heat dissipation is required for the head-mounted device, the heat dissipation fan is activated to dissipate heat of the head-mounted device, which improves the heat dissipation capability of the head-mounted device, avoids damage to the head-mounted device due to heat accumulation in the head-mounted device, and ensures the service life of the head-mounted device.

Figure 1:
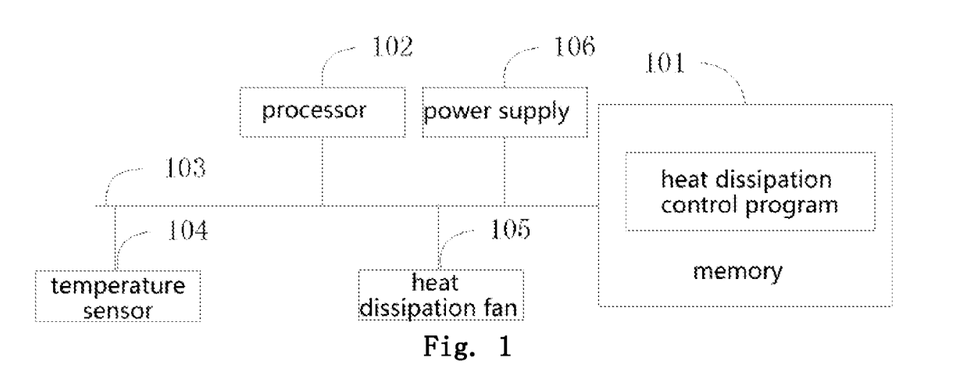
FIG. 1 is a schematic view of the hardware structure of a head-mounted device according to an embodiment of the present disclosure.

As an implementation, the head-mounted device may be embodied as shown in FIG. 1.

The embodiment of the present disclosure provides a head-mounted device, which includes a memory 101, a processor 102 (e.g. a CPU), a communication bus 103, a temperature sensor 104, a heat dissipation fan 105, and a power supply 106. Wherein, the communication bus 103 is used to realize connection communication between these components. The temperature sensor 104 may be disposed on a mainboard of the head-mounted device, and one or more temperature sensors 104 may be provided. When a plurality of temperature sensors 104 are provided, each module on the mainboard is correspondingly provided with one temperature sensor 104, and the module may be a CPU (Central Processing Unit), a GPU (Graphics Processing Unit), a IMU (Inertial measurement Unit), a camera (Camera), a PMIC (Power Management IC) and a DDR (Double Data Rate) memory and the like.

The memory 101 may be a high-speed RAM storage device or a non-volatile memory, for example, a disk storage device. As shown in FIG. 1, the memory 101 may include a heat dissipation control program, and the processor 102 may be used to call the heat dissipation control program stored in the memory 101 and perform the following operations:
  obtaining a temperature acquired by the temperature sensor and an electric quantity of the power supply periodically or in real time; and
  activating the heat dissipation fan when it is determined that the head-mounted device satisfies a heat dissipation condition according to the temperature and the electric quantity.

In an embodiment, the processor 102 may be used to call the heat dissipation control program stored in the memory 101 and perform the following operations:
  determining a first temperature change rate of the head-mounted device periodically according to the temperature acquired by the temperature sensor;
  determining a target rotational speed of the heat dissipation fan according to the first temperature change rate; and
  adjusting the rotational speed of the heat dissipation fan according to the target rotational speed.

In an embodiment, the processor 102 may be used to call the heat dissipation control program stored in the memory 101 and perform the following operations:
  when a current first temperature change rate is less than the first temperature change rate determined last time, updating the cumulative number of times that the current first temperature change rate is continuously less than the first temperature change rate determined last time;
  when the cumulative number of times reach a preset number of times, clearing the cumulative number of times, and determining the target rotational speed of the heat dissipation fan according to a preset proportional value and the current rotational speed of the heat dissipation fan, wherein the preset proportional value of the heat dissipation fan is less than 1.

In an embodiment, the processor 102 may be used to call the heat dissipation control program stored in the memory 101 and perform the following operations:
  determining the target rotational speed of the heat dissipation fan according to the first temperature change rate and a current electric quantity of the power supply.

In an embodiment, the processor 102 may be used to call the heat dissipation control program stored in the memory 101 and perform the following operations:
  performing a weighted calculation to the first temperature change rate and the current electric quantity of the power supply to determine a first reference parameter according to a weight corresponding to the first temperature change rate and a weight corresponding to the current electric quantity of the power supply; and
  determining the target rotational speed of the heat dissipation fan according to a mapping relationship between the reference parameter and the rotational speed of the heat dissipation fan, and the first reference parameter.

In an embodiment, the processor 102 may be used to call the heat dissipation control program stored in the memory 101 and perform the following operations:
  the first reference parameter is determined by a weighting formula, the weighting formula is $R=0.7*K+0.3*C$; wherein, R is the first reference parameter, K is the temperature, 0.7 is weight corresponding to the temperature, C is the electric quantity, and 0.3 is the weight corresponding to the electric quantity.

In an embodiment, the processor 102 may be used to call the heat dissipation control program stored in the memory 101 and perform the following operations:
  determining whether the first temperature change rate is less than or equal to a preset change rate;
  when it is determined that the first temperature change rate is less than or equal to the preset change rate, controlling the heat dissipation fan to stop operating; and
  when it is determined that the first temperature change rate is greater than the preset change rate, performing the step of determining the target rotational speed of the heat dissipation fan according to the first temperature change rate.

In an embodiment, the processor 102 may be used to call the heat dissipation control program stored in the memory 101 and perform the following operations:
  when a second reference parameter is greater than or equal to a first preset threshold value, it is determined that the head-mounted device satisfies the heat dissipation condition, wherein the second reference parameter is determined according to a second temperature change rate of the head-mounted device and the electric quantity, and the second temperature change rate is determined by the temperature acquired by the temperature sensor.

In an embodiment, the processor 102 may be used to call the heat dissipation control program stored in the memory 101 and perform the following operations:

when a second reference parameter is greater than or equal to a first preset threshold value and second temperature change rates within a preset time period increase sequentially, it is determined that the head-mounted device satisfies the heat dissipation condition, wherein the second reference parameter is determined according to the second temperature change rate of the head-mounted device and the electric quantity, and the second temperature change rate is determined by the temperature acquired by the temperature sensor.

In an embodiment, the processor 102 may be used to call the heat dissipation control program stored in the memory 101 and perform the following operations:

determining whether the head-mounted device satisfies the heat dissipation condition according to the temperature and the electric quantity;

wherein the step of determining whether the head-mounted device satisfies the heat dissipation condition according to the temperature and the electric quantity includes:

determining a third temperature change rate corresponding to each module according to a temperature acquired by the temperature sensor corresponding to the module;

determining a third reference parameter corresponding to each module according to the third temperature change rate and the electric quantity; and determining whether the third reference parameter satisfies a preset condition, wherein when third reference parameters satisfy the preset condition, it is determined that the head-mounted device satisfies the heat dissipation condition.

In an embodiment, the processor 102 may be used to call the heat dissipation control program stored in the memory 101 and perform the following operations:

any one of the third reference parameters is greater than or equal to a second preset threshold value;

or, a weighted parameter obtained by performing a weighted calculation to the third reference parameters is greater than or equal to a third preset threshold value.

In an embodiment, the processor 102 may be used to call the heat dissipation control program stored in the memory 101 and perform the following operations:

determining a target heat dissipation fan among the heat dissipation fans, wherein the third reference parameter of at least one module corresponding to the target heat dissipation fan is greater than or equal to the second preset threshold value, or, a weighted parameter corresponding to the target heat dissipation fan obtained by performing a weighted calculation to the third reference parameter of modules corresponding to the target heat dissipation fan is greater than or equal to the third preset threshold value; and activating the target heat dissipation fan.

According to the above technical solution of the present embodiment, the head-mounted device is provided with a temperature sensor, a heat dissipation fan and a power supply therein, and the head-mounted device acquires the temperature acquired by the temperature sensor and the electric quantity of the power supply in real time or periodically, and when it is determined that the head-mounted device satisfies the heat dissipation condition according to the temperature and the electric quantity, activates the heat dissipation fan to dissipate heat of the head-mounted device. When it is determined that heat dissipation is required for the head-mounted device, the heat dissipation fan is activated to dissipate heat of the head-mounted device, which improves the heat dissipation capability of the head-mounted device, avoids damage to the head-mounted device due to heat accumulation in the head-mounted device, and ensures the service life of the head-mounted device.

Based on the hardware structure of the head-mounted device described above, the present disclosure proposes embodiments of the heat dissipation method for the head-mounted device.

Figure 2:
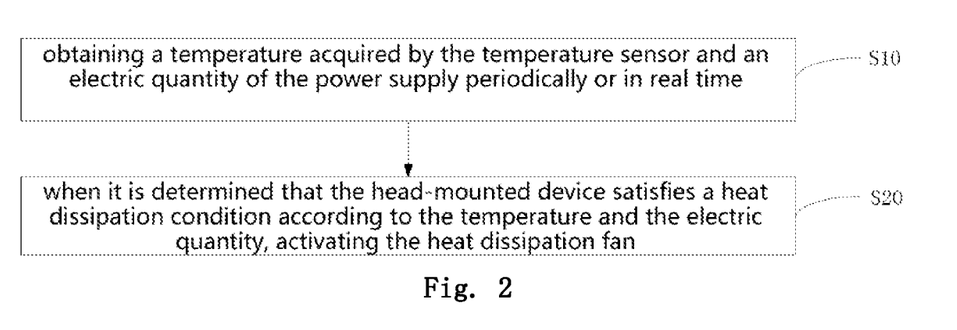
FIG. 2 is a schematic flowchart of a heat dissipation method for a head-mounted device according to a first embodiment of the present disclosure.

Referring to FIG. 2, FIG. 2 is a schematic flowchart of a heat dissipation method for a head-mounted device according to a first embodiment of the present disclosure. The heat dissipation method for a head-mounted device includes the following steps:

At step S10, obtaining a temperature acquired by the temperature sensor and an electric quantity of the power supply periodically or in real time.

In the resent embodiment, an executive body is the head-mounted device, the head-mounted device may be either a VR head-mounted device or an AR head-mounted device. The head-mounted device is equipped with a temperature sensor, a heat dissipation fan and a power supply therein. The temperature sensor is disposed on the mainboard of the head-mounted device, and the mainboard is a control mainboard of the head-mounted device. The temperature sensor collects the temperature of the mainboard in real time or periodically, and transmits the temperature to a processor of the head-mounted device. The head-mounted device is further provided with a module for detecting the electric quantity of the power supply, and the module may also send the electric quantity acquired in real time or periodically to the processor. It should be noted that the acquired electric quantity of the power supply is associated with the temperature acquired by the temperature sensor, and the associated electric quantity of power supply and temperature are sent to the processor. The electric quantity of the power supply may be a remaining electric quantity or a used electric quantity of the power supply.

At step S20, activating the heat dissipation fan when it is determined that the head-mounted device satisfies a heat dissipation condition according to the temperature and the electric quantity.

The temperature may indicate the degree of heat accumulation inside the head-mounted device, and the electric quantity of the power supply indicates the remaining usage time of the head-mounted device. The power supply is mainly used for the normal operation of the head-mounted device so that the user can normally experience the virtual world, that is to say, the main function of the power supply is to provide the head-mounted device with virtual function operation. Therefore, the heat dissipation condition of the head-mounted device needs to comprehensively consider the internal temperature of the head-mounted device and the electric quantity of the battery.

In this regard, the head-mounted device can set the heat dissipation condition according to the temperature and the electric quantity of the power supply, the lower the power of the power supply is, the higher the temperature that the head-mounted device can tolerate. The head-mounted device can determine an upper limit temperature according to the electric quantity of the power supply, and the upper limit temperature is the maximum temperature which can be tolerated by the head-mounted device. The head-mounted device compares the current temperature and upper limit temperature, and if the current temperature is greater than or equal to the upper limit temperature, the head-mounted device satisfies the heat dissipation condition, and the head-mounted device needs to activate the heat dissipation fan to dissipate heat of the head-mounted device. If the current temperature is less than the upper limit temperature, the head-mounted device does not satisfy the heat dissipation condition, that is to say, the head-mounted device does not need to activate the heat dissipation fan.

It should be noted that the heat dissipation fan is started at a high speed, and an initial rotational speed may be defined as greater than a preset rotational speed, wherein the preset rotational speed indicates a high rotational speed of the heat dissipation fan, so as to quickly dissipate heat of the head-mounted device. The preset rotational speed may be the maximum rotational speed of the heat dissipation fan. Of course, the preset rotational speed can be determined according to the electric quantity of the power supply. The larger the electric quantity is, the higher the preset rotational speed is.

In the technical solution provided by the present embodiment, the head-mounted device is provided with a temperature sensor, a heat dissipation fan and a power supply therein, the head-mounted device acquires the temperature acquired by the temperature sensor and the electric quantity of the power supply in real time or periodically, the heat dissipation fan is activated to dissipate heat of the head-mounted device when it is determined that the head-mounted device satisfies the heat dissipation condition according to the temperature and the electric quantity. Since the heat dissipation fan is activated to dissipate heat of the head-mounted device when it is determined that heat dissipation is required for the head-mounted device, the heat dissipation capability of the head-mounted device is improved, damage to the head-mounted device due to heat accumulation in the head-mounted device is avoided, and the service life of the head-mounted device is ensured.

Figure 3:
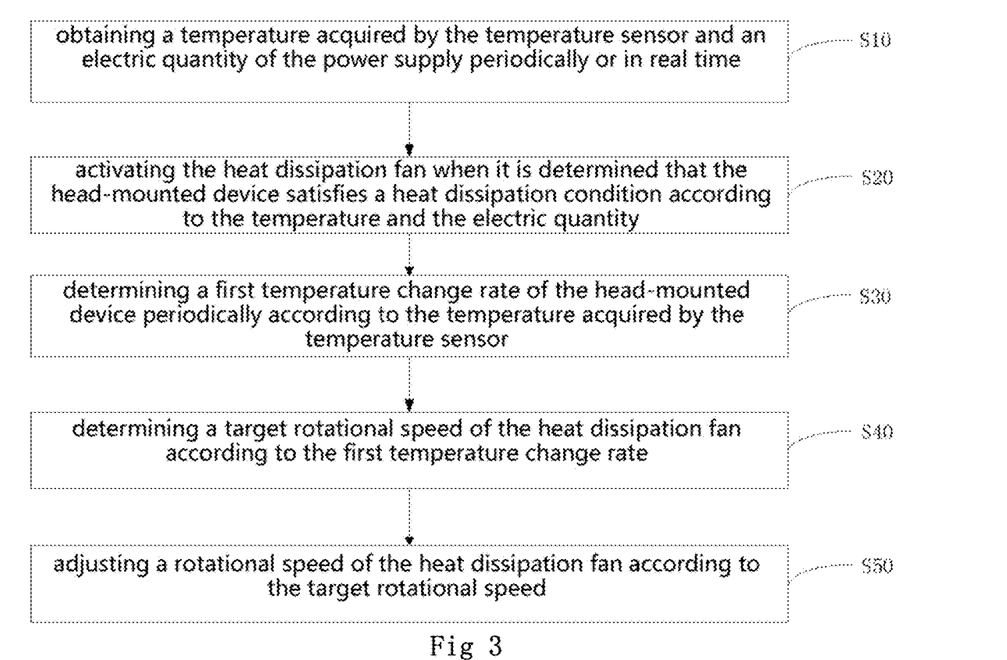
FIG. 3 is a schematic flowchart of the heat dissipation method for a head-mounted device according to a second embodiment of the present disclosure.

Referring to FIG. 3, FIG. 3 shows the heat dissipation method for a head-mounted device according to a second embodiment of the present disclosure. Based on the first embodiment, after the step S20, the heat dissipation method for the head-mounted device further includes:

Step S30, determining a first temperature change rate of the head-mounted device periodically according to the temperature acquired by the temperature sensor;

Step S40, determining a target rotational speed of the heat dissipation fan according to the first temperature change rate; and Step S50, adjusting the rotational speed of the heat dissipation fan according to the target rotational speed.

In the present embodiment, after the head-mounted device activates the heat dissipation fan, since the power supply is mainly used to provide the head-mounted device with a virtual function for normal operation, that is, it is necessary to consider the duration time of the virtual experience provided by the head-mounted device. At the same time, the head-mounted device needs to ensure that the internal heat is not too high. Therefore, the rotational speed of the fan needs to be adjusted so as to ensure both of the duration time of the virtual experience and the service life of the head-mounted device.

In this regard, after activating the heat dissipation fan, the head-mounted device determines the first temperature change rate according to the temperature acquired by the temperature sensor periodically. Since the temperature sensor collects a temperature periodically, the interval time for collecting temperature is known, a temperature difference value can be obtained by subtracting the temperature acquired last time from the current acquired temperature, and the first temperature change rate is obtained by dividing the temperature difference value by the interval duration. The first temperature change rate may be understood as a slope of the point on the temperature change curve.

The magnitude of the first temperature change rate represents the temperature change in the head-mounted device, so the head-mounted device can determine the target rotational speed of the heat dissipation fan according to the first temperature change rate. The larger the first temperature change rate is, the higher the target rotational speed is. After the target rotational speed is determined, the head-mounted device operates in accordance with the target rotational speed, that is, the current rotational speed is replaced with the target rotational speed.

The head-mounted device acquires the first temperature change rate every preset time interval, that is to say, the head-mounted device adjusts the rotational speed of the fan every preset time interval. The preset time interval may be any appropriate time interval.

In the technical solution provided by the present embodiment, the head-mounted device determines the first temperature change rate of the head-mounted device periodically according to the temperature acquired by the temperature sensor, and determines the target rotational speed of the heat dissipation fan according to the temperature change rate, so as to reasonably adjust the rotational speed of the heat dissipation fan.

Figure 4:
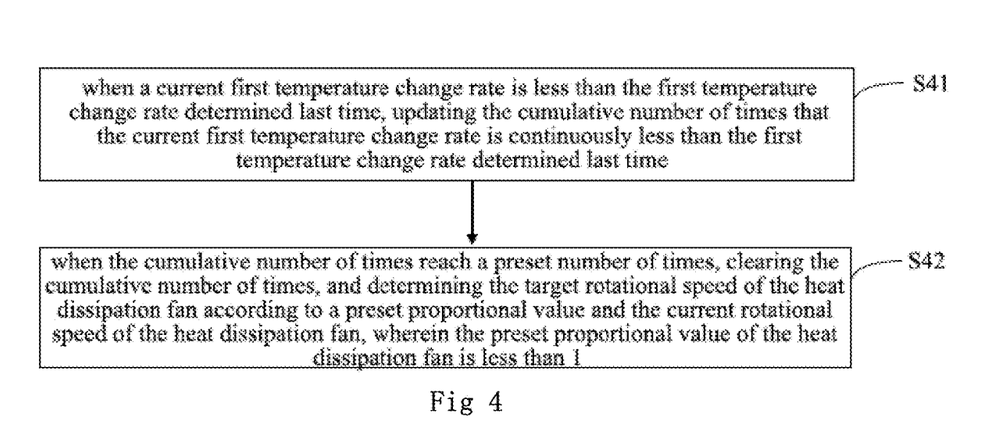
FIG. 4 is a detailed schematic flowchart of step S40 in the heat dissipation method for a head-mounted device according to a third embodiment of the present disclosure.

Referring to FIG. 4, FIG. 4 shows the heat dissipation method for a head-mounted device according to a third embodiment of the present disclosure. Based on the second embodiment, the step S40 includes:

Step S41, when a current first temperature change rate is less than the first temperature change rate determined last time, updating the cumulative number of times that the current first temperature change rate is continuously less than the first temperature change rate determined last time;

Step S42, when the cumulative number of times reach a preset number of times, clearing the cumulative number of times, and determining the target rotational speed of the heat dissipation fan according to a preset proportional value and the current rotational speed of the heat dissipation fan, wherein the preset proportional value of the heat dissipation fan is less than 1.

In the present embodiment, the head-mounted device adjusts the rotational speed of the dissipation fan every preset time interval, each adjustment corresponds to one first temperature change rate. After obtaining the current first temperature change rate, the head-mounted device determines whether the current first temperature change rate is greater than the temperature change rate determined last time. If the current first temperature change rate is greater than the temperature change rate determined last time, it indicates that the temperature rising trend of the head-mounted device becomes slower (the first temperature change rate is a positive value) or the temperature of the head-mounted device decreases (the first temperature change rate is a negative value). It will be understood that the current first temperature change rate becomes smaller includes the above two circumstances, and the temperature rising trend of the head-mounted device becomes slower indicates that the temperature of the head-mounted device is still rising, and at this time, the rotational speed of the fan cannot be reduced. In this regard, a preset number of times is set in the head-mounted device, and when it is determined that the current first temperature change rate is less than the temperature change rate determined last time, the cumulative number of times that the current first temperature change rate is less than the first temperature change rate determined last time is added by 1, and the head-mounted device obtains the cumulative number of times. The head-mounted device compares the cumulative number of times with the preset number of times, and if the cumulative number of times reach the preset number of times, clear the cumulative number of times, and it is determined that the rotational speed of the heat dissipation fan needs to be reduced. As for reducing the rotational speed of the heat dissipation fan, a target rotational speed can be obtained by multiplying a preset proportional value with the current rotational speed, and the preset proportional value is less than 1, so that the target rotational speed is less than the current rotational speed. The preset proportional value is the proportional value preset, and the preset proportional value may be any appropriate value, for example, 0.7. The preset number of times may be any appropriate value, for example, the preset number of times may be 5, that is, the first temperature change rate continuously decreases for 5 times, and thereby the rotational speed of the heat dissipation fan decreases.

When the cumulative number of times is less than the preset number of times, the current rotational speed of the heat dissipation fan is determined as the target rotational speed, that is to say, it is not necessary to reduce the rotational speed of the heat dissipation fan.

In the technical solution provided by the present embodiment, when the head-mounted device determines that the current first temperature change rate is less than the first temperature change rate determined last time, it determines the cumulative number of times that the current first temperature change rate is continuously less than the first temperature change rate determined last time, and when the cumulative number of times reach the preset number of times, the rotational speed of the fan is reduced to save the power of the power supply.

Figure 5:
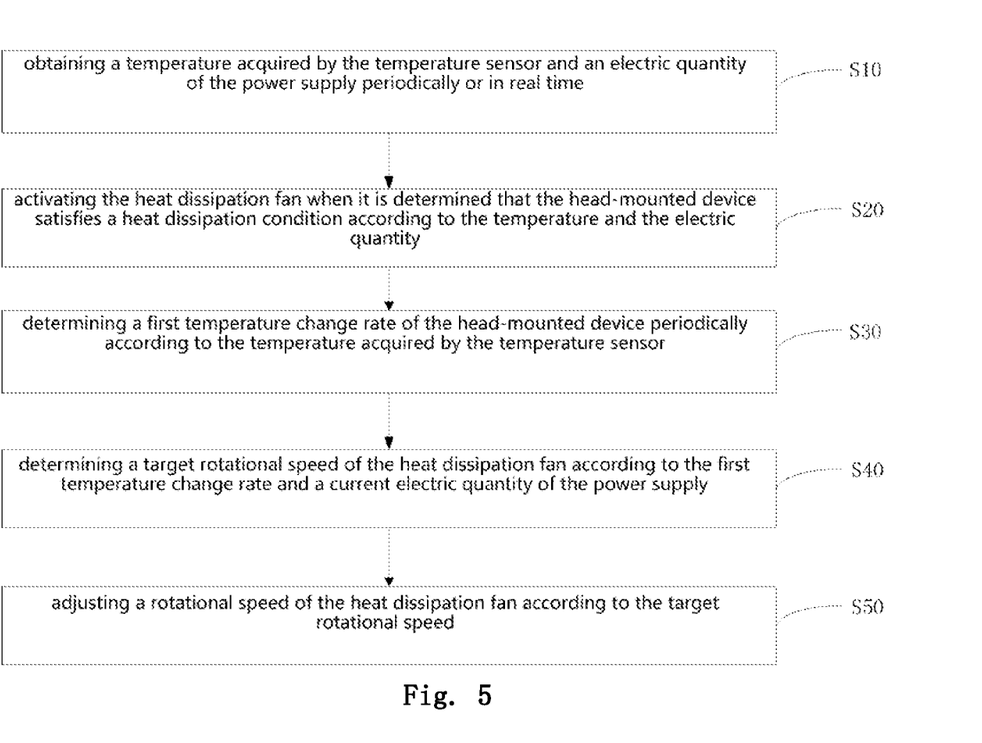
FIG. 5 is a schematic flowchart of the heat dissipation method for a head-mounted device according to a fourth embodiment of the present disclosure.

Referring to FIG. 5, FIG. 5 shows the heat dissipation method for a head-mounted device according to a fourth embodiment of the present disclosure. Based on the second embodiment, the step S40 includes:

Step S43, determining the target rotational speed of the heat dissipation fan according to the first temperature change rate and a current electric quantity of the power supply.

In the present embodiment, the first temperature change rate indicates the change of the internal temperature of the head-mounted device, and the electric quantity of the power supply indicates the duration of virtual experience of the head-mounted device. Therefore, the head-mounted device can determine a first reference parameter according to the first temperature change rate and the current electricity quantity of the power supply. The larger the first temperature change rate is, the greater the electric quantity (remaining electric quantity) of the power supply is, and the greater the first reference parameter is. The head-mounted device can determine the target rotational speed of the heat dissipation fan by the first reference parameter, that is to say, there is a mapping relationship between the reference parameter and the rotational speed of the heat dissipation fan, and the mapping relationship is stored in the head-mounted device. The larger the first reference parameter is, the larger the target rotational speed is.

Furthermore, considering that the heat dissipation of the head-mounted device mainly relates to a temperature change, corresponding weights can be set for the first temperature change rate and the electric quantity of the power supply, and the weight of the electric quantity is less than the weight of the first temperature change rate. For example, $R=0.7*K+0.3*C$, wherein R is the first reference parameter, K is the temperature, 0.7 is weight corresponding to the temperature, C is the remaining electric quantity of the power supply, and 0.3 is the weight of the remaining electric quantity. The remaining electric quantity indicates the endurance of the head-mounted device, and the temperature represents the degree of heat accumulation inside the head-mounted device. When the remaining electric quantity is large, the head-mounted device pays more attention to the internal heat dissipation. Based on the fact that the heat dissipation of the head-mounted device is different from that of other electronic devices, the applicant found through several simulations that when the weight of temperature is set relatively large and the weight of electric quantity is set relatively small, the head-mounted device has better heat dissipation effect. The applicant has conducted many times of tests, and finally found that when the weight of temperature is 0.7 and the weight of electric quantity is 0.3, it can not only ensure the heat dissipation of the head-mounted device in time, but also ensure a long endurance of the head-mounted device.

Of course, the weights of the remaining electric quantity and the first temperature change rate can be any appropriate value, and are not limited to the above examples. It will be understood that the head-mounted device can perform a weighted calculation to the first temperature change rate and the current electric quantity of the power supply according to the weight corresponding to the first temperature change rate and the weight corresponding to the current electric quantity of the power supply so as to determine the first reference parameter. In addition, in the above, the reference parameter is determined based on the remaining electric quantity and the temperature change rate, the head-mounted device may also determine the reference parameter according to the used electric quantity and the temperature change rate, and the larger the temperature change rate is, the smaller the used electric quantity is, and the larger the reference parameter is.

In the technical solution provided by the present embodiment, the head-mounted device determines the first reference parameter according to the first temperature change rate and the current electricity quantity, so as to accurately determine the target rotational speed of the heat dissipation fan according to the first reference parameter.

Figure 6:
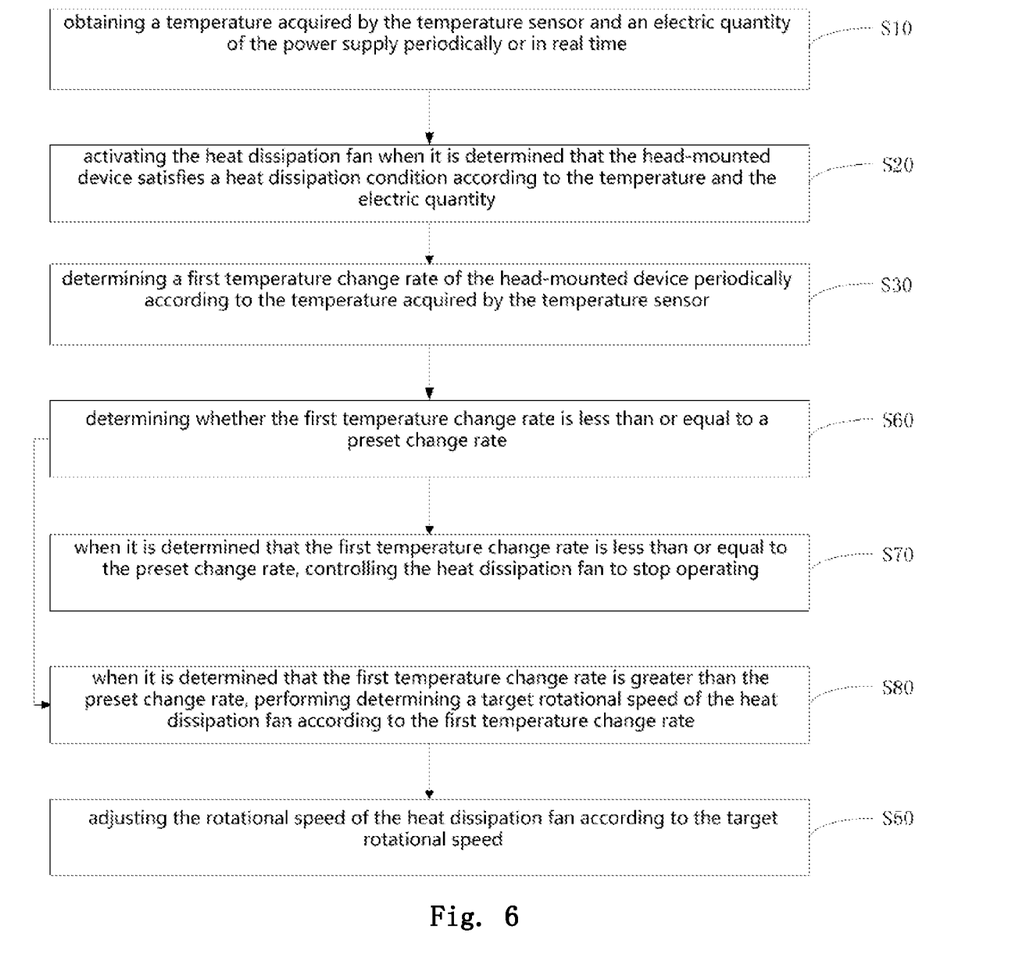
FIG. 6 is a schematic flowchart of the heat dissipation method for a head-mounted device according to a fifth embodiment of the present disclosure.

Referring to FIG. 6, FIG. 6 shows the heat dissipation method for a head-mounted device according to a fifth embodiment of the present disclosure. Based on any one of the second to the fourth embodiments, after the step S30, the heat dissipation method for the head-mounted device further includes:

Step S60, determining whether the first temperature change rate is less than or equal to a preset change rate;

Step S70, when it is determined that the first temperature change rate is less than or equal to the preset change rate, controlling the heat dissipation fan to stop operating; and Step S80, when it is determined that the first temperature change rate is greater than the preset change rate, performing the step of determining the target rotational speed of the heat dissipation fan according to the first temperature change rate.

In the present embodiment, after determining the first temperature change rate, the head-mounted device determines whether the first temperature change rate is less than or equal to a preset change rate. The preset change rate is a small value, which indicates that there is less heat in the head-mounted device, and the preset change rate may be any appropriate value. For example, the preset change rate is zero.

When the first temperature change rate is determined to be less than or equal to the preset change rate, the head-mounted device can control the heat dissipation fan to stop operating so as to save the electric quantity. When it is determined that the first temperature change rate is greater than the preset change rate, the head-mounted device needs to continue to operate. At this time, perform the step S40.

In the technical solution provided by the present embodiment, after obtaining the first temperature change rate, the head-mounted device determines whether the first temperature change rate is less than or equal to the preset change rate. If so, the head-mounted device controls the fan to stop operating so as to save the power of the power supply.

In an embodiment, the head-mounted device determines whether the head-mounted device needs to dissipate heat, that is, whether the head-mounted device satisfies the heat dissipation condition, based on the temperature change rate and the electric quantity of the power supply.

Specifically, after obtaining the temperature acquired by the temperature sensor, the head-mounted device calculates a second temperature change rate. The calculation method for the second temperature change rate refers to the calculation process of the first temperature change rate, and will not be repeated herein. The head-mounted device determines the second reference parameter according to the second temperature change rate and the electric quantity, and the determination method for the second reference parameter refers to the determination process of the first reference parameter. Then, the head-mounted device determines whether the second reference parameter is greater than or equal to a first preset threshold value, the first preset threshold value may be any appropriate value, for example, the first preset threshold value may be 1.5. When it is determined that the second reference parameter is greater than or equal to the first preset threshold value, the head-mounted device satisfies the heat dissipation condition, and thereby the head-mounted device controls the activating of the heat dissipation fan.

In the technical solution provided by the present embodiment, after obtaining the temperature acquired by the temperature sensor, the head-mounted device calculates the second temperature change rate, and determines the second reference parameter according to the second temperature change rate. If the second reference parameter is greater than or equal to the first preset threshold value, the head-mounted device controls the heat dissipation fan to operate so as to dissipate heat of the head-mounted device.

In an embodiment, the temperature inside the head-mounted device may become very high, and may decrease subsequently. Therefore, it is not accurate that the head-mounted device controls the heat dissipation fan to operate according to the temperature. In this regard, the head-mounted device determines whether the head-mounted device needs to activate the heat dissipation fan according to the temperature change rate within a preset time period.

The duration of the preset time period is a fixed duration, and the interval duration corresponding to the temperature change rate is less than a first duration corresponding the preset time period. The first duration may be set to include a plurality of interval durations, that is, a preset number of second temperature change rates are included within the preset time period. If the temperature change rates of the preset time period increase sequentially in accordance with the time sequence, it can be accurately determined that the temperature of the head-mounted device has a rising trend, and the head-mounted device needs to perform heat dissipation, that is, it can be determined that the head-mounted device satisfies the heat dissipation condition so as to finally determine whether to start the heat dissipation fan according to the second reference parameter. It can be understood that the head-mounted device activates the heat dissipation fan when the temperature change rate is maximum, rather than when the temperature exceeds a temperature node. In addition, when it is determined that the second temperature change rates within the preset time period increase sequentially in accordance with the time sequence, the second reference parameter can be further calculated, and when the second reference parameter is greater than the first preset threshold value, it is determined that the head-mounted device satisfies the heat dissipation condition.

It should be noted that the head-mounted device can perform timing. When the duration of the timing reaches the first duration, a preset time period can be obtained, and the head-mounted device determines whether the second temperature change rates within the preset time period increase sequentially. If the temperature change rates do not increase sequentially, the head-mounted device clears the duration of the timing and restarts timing to determine whether the head-mounted device needs to activate the heat dissipation fan.

In the technical solution provided by the present embodiment, the head-mounted device acquires each of the second temperature change rates within the preset time period. If the second temperature change rates increase sequentially, it is determined that the head-mounted device needs to perform heat dissipation.

Figure 7:
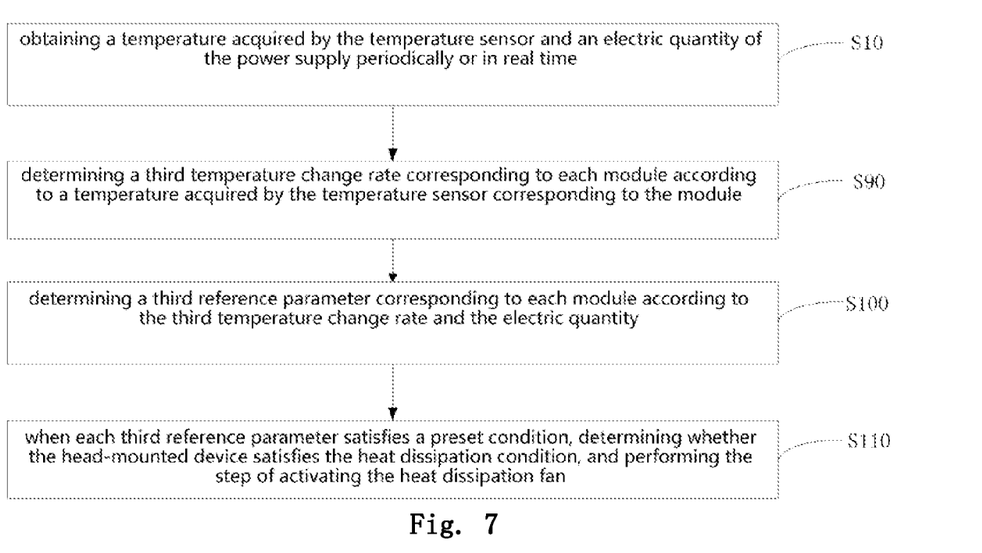
FIG. 7 is a schematic flowchart of the heat dissipation method for a head-mounted device according to a sixth embodiment of the present disclosure.

Referring to FIG. 7, FIG. 7 shows the heat dissipation method for a head-mounted device according to a sixth embodiment of the present disclosure. Based on any one of the second to the fifth embodiments, after the step S10, the heat dissipation method for the head-mounted device further includes:

Step S90, determining a third temperature change rate corresponding to each module according to a temperature acquired by the temperature sensor corresponding to the module;

Step S100, determining a third reference parameter corresponding to each module according to the third temperature change rate and the electric quantity; and Step S110, when each third reference parameter satisfies a preset condition, determining whether the head-mounted device satisfies the heat dissipation condition, and performing the step of activating the heat dissipation fan.

In the present embodiment, the mainboard of the head-mounted device includes a plurality of modules, each of which is provided with a corresponding temperature sensor. The module on the mainboard may be a CPU (Central Processing Unit), a GPU (Graphics Processing Unit), a IMU (Inertial measurement Unit), a camera (Camera), a PMIC (Power Management IC) and a DDR (Double Data Rate) memory and the like.

The head-mounted device may obtain a temperature corresponding to each of the modules to calculate a third temperature change rate corresponding to each module, and then determine a third reference parameter corresponding to each of the modules according to the third temperature change rate and the electricity quantity. The calculation parameters of the third temperature change rate and the third reference parameter refer to the above description and will not be repeated herein.

The head-mounted device determines whether the third reference parameter satisfies the preset condition. When the third reference parameters satisfy the preset condition, it is determined that the head-mounted device satisfies the heat dissipation condition. In particular, the preset condition includes: any one of the third reference parameters is greater than or equal to a second preset threshold value; or, a weighted parameter obtained by performing a weighted calculation to the third reference parameters is greater than or equal to a third preset threshold value. The second preset threshold value and the third preset threshold value may be any appropriate value. The weight of each module can be set in advance, and the head-mounted device may also determine the weight of the modules according to the importance level of the modules. For example, a CPU is the most important portion of the head-mounted device so the weight of the CPU is the largest.

The head-mounted device may be provided with a plurality of heat dissipation fans, and one heat dissipation fan is correspondingly provided with one or more modules. Each of the heat dissipation fans can operate independently. Accordingly, when the third reference parameter of at least one module corresponding to the heat dissipation fan is greater than or equal to the second preset threshold value, or when the weighted parameter of modules corresponding to the heat dissipation fan is greater than or equal to the third preset threshold value, the heat dissipation fan is determined as the target heat dissipation fan to function as the target heat dissipation fan.

In the technical solution provided by the present embodiment, each module on the mainboard of the head-mounted device is correspondingly provided with a temperature sensor, and when the temperature change rate corresponding to each of the modules satisfies the preset condition, the heat dissipation fan is activated to dissipate heat.

The present disclosure also provides a head-mounted device, the head-mounted device includes a temperature sensor, a heat dissipation fan, a power supply, a memory, a processor, and a heat dissipation control program stored in the memory and operable on the processor, wherein the heat dissipation fan, the power supply and the temperature sensor are connected with the processor, and when the heat dissipation control program is executed by the processor, the steps of the heat dissipation method for a head-mounted device as described above are implemented.

The present disclosure also provides a computer-readable storage medium, wherein a heat dissipation control program is stored in the computer-readable storage medium, and when the heat dissipation control program is executed by a processor, the steps of the heat dissipation method for a head-mounted device as described above are implemented.

The various embodiments in this specification are described in a parallel or progressive manner, and each embodiment focuses on the differences from other embodiments, and the same or similar parts between the various embodiments may be referred to each other. As for the device disclosed in the embodiment, since it corresponds to the method disclosed in the embodiment, the description is relatively simple. For relevant parts, please refer to the description of the method.

Those of ordinary skill in the art will understand that the units and algorithm steps of each example described in conjunction with the embodiments disclosed herein can be implemented by electronic hardware, computer software, or a combination thereof. In order to clearly explain the interchangeability of hardware and software, the composition and steps of each example have been generally described in the above description in terms of function. Whether these functions are performed in hardware or software depends on the specific application and design constraints of the embodiment. Those skilled in the art may implement the described functions for each specific application using different methods, but such implementations should not be considered beyond the scope of the present application.

The steps of the method or algorithm described in connection with the embodiments disclosed herein may be directly implemented by hardware, a software module executed by a processor, or a combination thereof. The software module may be disposed in a random access memory (RAM), a memory, a read only memory (ROM), an electrically programmable ROM, an electrically erasable programmable ROM, a register, a hard disk, a removable disk, a CD-ROM, or any other form of storage medium known in the art.

It should be noted that relational terms such as first and second described herein are only used to distinguish one entity or operation from another entity or operation, and do not necessarily require or imply any such actual relationship or order between these entities or operations. Moreover, terms such as "comprise", "include" or any other variation thereof are intended to encompass a non-exclusive inclusion such that a process, method, article or apparatus that includes a series of elements includes not only those elements, but also other elements not explicitly listed, or elements inherent to such a process, method, article or apparatus. Without further limitation, the element defined by the phrase "comprising a . . . " does not preclude the presence of additional identical elements in the process, method, article or apparatus including the element.

What is claimed is:

1. A heat dissipation method for a head-mounted device, wherein the head-mounted device is provided with a temperature sensor, a heat dissipation fan and a power supply therein, the heat dissipation method for the head-mounted device is performed by the head-mounted device, the heat dissipation method for the head-mounted device comprising:

obtaining a temperature acquired by the temperature sensor and an electric quantity of the power supply periodically or in real time;

activating the heat dissipation fan in response to the head-mounted device satisfies satisfying a heat dissipation condition according to the temperature and the electric quantity;

determining a first temperature change rate of the head-mounted device periodically according to the temperature acquired by the temperature sensor;

determining a target rotational speed of the heat dissipation fan according to the first temperature change rate, wherein determining the target rotational speed of the heat dissipation fan according to the first temperature change rate comprises:

in response to a current first temperature change rate being less than a first temperature change rate determined last time, updating a cumulative number of times that the current first temperature change rate is continuously less than the first temperature change rate determined last time, in response to the cumulative number of times reaching a preset number of times, clearing the cumulative number of times, and determining the target rotational speed of the heat dissipation fan according to a preset proportional value and a current rotational speed of the heat dissipation fan, wherein the preset proportional value is less than 1, and wherein determining the target rotational speed of the heat dissipation fan according to the first temperature change rate comprises determining the target rotational speed of the heat dissipation fan according to the first temperature change rate and a current electric quantity of the power supply; and wherein the heat dissipation method for the head-mounted device further comprises adjusting a rotational speed of the heat dissipation fan according to the target rotational speed to ensure that an internal heat of the head-mounted device is not too high.

2. The heat dissipation method for the head-mounted device of claim 1, wherein determining the target rotational speed of the heat dissipation fan according to the first temperature change rate and the current electric quantity of the power supply comprises:

performing a weighted calculation to the first temperature change rate and the current electric quantity of the power supply to determine a first reference parameter according to a weight corresponding to the first temperature change rate and a weight corresponding to the current electric quantity of the power supply; and determining the target rotational speed of the heat dissipation fan according to a mapping relationship between a reference parameter and the rotational speed of the heat dissipation fan, and the first reference parameter.

3. The heat dissipation method for the head-mounted device of claim 2, wherein the first reference parameter is determined by a weighting formula, the weighting formula is $R=0.7*K+0.3*C$, wherein, R is the first reference parameter, K is the temperature, 0.7 is weight corresponding to the temperature, C is the electric quantity, and 0.3 is the weight corresponding to the electric quantity.

4. The heat dissipation method for the head-mounted device of claim 1, wherein after determining the first temperature change rate of the head-mounted device periodically according to the temperature acquired by the temperature sensor, the method further comprises:

determining whether the first temperature change rate is less than or equal to a preset change rate;

in response to the first temperature change rate is being less than or equal to the preset change rate, controlling the heat dissipation fan to stop operating; and in response to the first temperature change rate is being greater than the preset change rate, performing determining a target rotational speed of the heat dissipation fan according to the first temperature change rate.

5. The heat dissipation method for the head-mounted device of claim 1, wherein in response to a second reference parameter is being greater than or equal to a first preset threshold value, it is determined that the head-mounted device satisfies the heat dissipation condition, wherein the second reference parameter is determined according to a second temperature change rate of the head-mounted device and the electric quantity, and the second temperature change rate is determined by the temperature acquired by the temperature sensor.

6. The heat dissipation method for the head-mounted device of claim 1, wherein in response to a second reference parameter being greater than or equal to a first preset threshold value and a second temperature change rate within a preset time period increasing sequentially, it is determined that the head-mounted device satisfies the heat dissipation condition, and wherein the second reference parameter is determined according to the second temperature change rate of the head-mounted device and the electric quantity, and the second temperature change rate is determined by the temperature acquired by the temperature sensor.

7. The heat dissipation method for the head-mounted device of claim 1, wherein each module on a mainboard of the head-mounted device is provided with a corresponding temperature sensor, and before activating the heat dissipation fan in response to the head-mounted device satisfying a heat dissipation condition according to the temperature and the electric quantity, the method further comprises:

determining whether the head-mounted device satisfies the heat dissipation condition according to the temperature and the electric quantity;

wherein determining whether the head-mounted device satisfies the heat dissipation condition according to the temperature and the electric quantity comprises:

determining a third temperature change rate corresponding to each module according to a temperature acquired by the temperature sensor corresponding to the module;

determining a third reference parameter corresponding to each module according to the third temperature change rate and the electric quantity; and determining whether the third reference parameter satisfies a preset condition, wherein in response to third reference parameters satisfying the preset condition, it is determined that the head-mounted device satisfies the heat dissipation condition.

8. The heat dissipation method for the head-mounted device of claim 7, wherein the preset condition comprises one of the following:

any one of the third reference parameters is greater than or equal to a second preset threshold value;

a weighted parameter obtained by performing a weighted calculation to the third reference parameters is greater than or equal to a third preset threshold value.

9. The heat dissipation method for the head-mounted device of claim 7, wherein the head-mounted device comprises a plurality of heat dissipation fans, the heat dissipation fans are disposed corresponding to one or more modules, and activating the heat dissipation fan comprises:

determining a target heat dissipation fan among the heat dissipation fans, wherein determining the target heat dissipation fan among the heat dissipation fans satisfies one of the following: the third reference parameter of at least one module corresponding to the target heat dissipation fan is greater than or equal to a second preset threshold value; a weighted parameter corresponding to the target heat dissipation fan obtained by performing a weighted calculation to the third reference parameter of modules corresponding to the target heat dissipation fan is greater than or equal to a third preset threshold value; and activating the target heat dissipation fan.

10. A head-mounted device, wherein the head-mounted device comprises a temperature sensor, a heat dissipation fan, a power supply, a memory, a processor, and a heat dissipation control program stored in the memory and operable on the processor, wherein the heat dissipation fan, the power supply and the temperature sensor are connected with the processor, and wherein when the heat dissipation control program is executed by the processor, steps of the heat dissipation method for a head-mounted device of claim 1 are implemented.

11. The head-mounted device of claim 10, wherein each module on a mainboard of the head-mounted device is provided with a corresponding temperature sensor, and the head-mounted device is provided with a plurality of heat dissipation fans, each of which is provided corresponding to one or more modules.

12. A non-transitory computer-readable storage medium, wherein a heat dissipation control program is stored in the computer-readable storage medium, and wherein when the heat dissipation control program is executed by a processor, steps of the heat dissipation method for a head-mounted device of claim 1 are implemented.

13. The heat dissipation method for the head-mounted device of claim 1, wherein the adjusting the rotational speed of the heat dissipation fan according to the target rotational speed comprises:
  adjusting the rotational speed of the heat dissipation fan every preset time interval.

14. The heat dissipation method for the head-mounted device of claim 1, wherein the adjusting the rotational speed of the heat dissipation fan according to the target rotational speed comprises:
  reducing the rotational speed of the heat dissipation fan.

* * * * *